(12) United States Patent
Shioya et al.

(10) Patent No.: US 7,906,803 B2
(45) Date of Patent: Mar. 15, 2011

(54) NANO-WIRE CAPACITOR AND CIRCUIT DEVICE THEREWITH

(75) Inventors: Shunsuke Shioya, Abiko (JP); Sotomitsu Ikeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 890 days.

(21) Appl. No.: 11/553,025

(22) Filed: Oct. 26, 2006

(65) Prior Publication Data

US 2007/0126079 A1   Jun. 7, 2007

(30) Foreign Application Priority Data

Dec. 6, 2005  (JP) ................................. 2005-352576

(51) Int. Cl.
*H01L 27/108* (2006.01)

(52) U.S. Cl. .................... 257/296; 257/532; 257/E51.04

(58) Field of Classification Search ................. 257/532, 257/296, 213, 77, 306, 9, 12, 14, 15, 20, 257/E51.003, E51.04, E51.038, E51.039; 977/943, 734, 742, 762, 773, 843, 890, 935
See application file for complete search history.

(56) References Cited

U.S. PATENT DOCUMENTS

| | | | |
|---|---|---|---|
| 3,976,922 A | 8/1976 | Peck et al. | |
| 6,759,305 B2* | 7/2004 | Lee et al. | 438/399 |
| 6,882,051 B2 | 4/2005 | Majumdar et al. | |
| 7,382,648 B2* | 6/2008 | Bockrath | 365/164 |
| 7,426,000 B2* | 9/2008 | Kim et al. | 349/43 |
| 7,554,621 B2* | 6/2009 | Mori | 349/43 |
| 7,608,877 B2* | 10/2009 | Shioya et al. | 257/296 |
| 2003/0100189 A1 | 5/2003 | Lee | |
| 2004/0112964 A1 | 6/2004 | Empedocles et al. | |
| 2005/0064185 A1* | 3/2005 | Buretea et al. | 428/364 |
| 2005/0167655 A1* | 8/2005 | Furukawa et al. | 257/20 |
| 2005/0212079 A1 | 9/2005 | Stumbo | |
| 2005/0219788 A1* | 10/2005 | Chow et al. | 361/305 |
| 2006/0008942 A1* | 1/2006 | Romano et al. | 438/99 |
| 2006/0049429 A1* | 3/2006 | Kim et al. | 257/213 |
| 2006/0081886 A1* | 4/2006 | Mostarshed et al. | 257/213 |
| 2006/0214262 A1* | 9/2006 | Mosley et al. | 257/532 |
| 2007/0012956 A1* | 1/2007 | Gutsche et al. | 257/246 |
| 2007/0040191 A1* | 2/2007 | Bezryadin et al. | 257/213 |
| 2007/0228433 A1* | 10/2007 | Forbes | 257/296 |

FOREIGN PATENT DOCUMENTS

JP    60-028124    8/1985

(Continued)

OTHER PUBLICATIONS

X. Duan et al., High-performance thin-film transistors using semiconductor nanowires and nanoribbons, Nature, Sep. 18, 2003, 274-278, vol. 425, Nature Publishing Group, England.

(Continued)

*Primary Examiner* — Matthew C Landau
*Assistant Examiner* — Latanya Crawford
(74) *Attorney, Agent, or Firm* — Canon U.S.A., Inc. I.P. Division

(57) ABSTRACT

A capacitor having a first electrode made of an electroconductive nano-wire, a dielectric layer partly covering the peripheral face of the first electrode, and a second electrode covering the peripheral face of the dielectric layer. In a circuit device employing the capacitor, a plurality of the capacitors are arranged roughly perpendicularly to a substrate in the circuit device or in parallel to a substrate in the circuit device.

1 Claim, 10 Drawing Sheets

FOREIGN PATENT DOCUMENTS

| | | |
|---|---|---|
| JP | 05-021295 A | 1/1993 |
| JP | 05-190397 A | 7/1993 |
| JP | 08-138973 A | 5/1996 |
| JP | 2003-073859 A | 3/2003 |
| JP | 2003-168745 A | 6/2003 |
| JP | 2004-146520 A | 5/2004 |
| KR | 2004-0069492 | 8/2004 |
| WO | 03107368 | 12/2003 |

OTHER PUBLICATIONS

Shelimov, Konstantin B et al, "Template-Grown high-density nanocapacitor arrays" Applied Physics Letter, AIP, American Institute of Physics, Sep. 11, 2000, vol. 77 No. 11, Melville, NY, XP012026139.

* cited by examiner

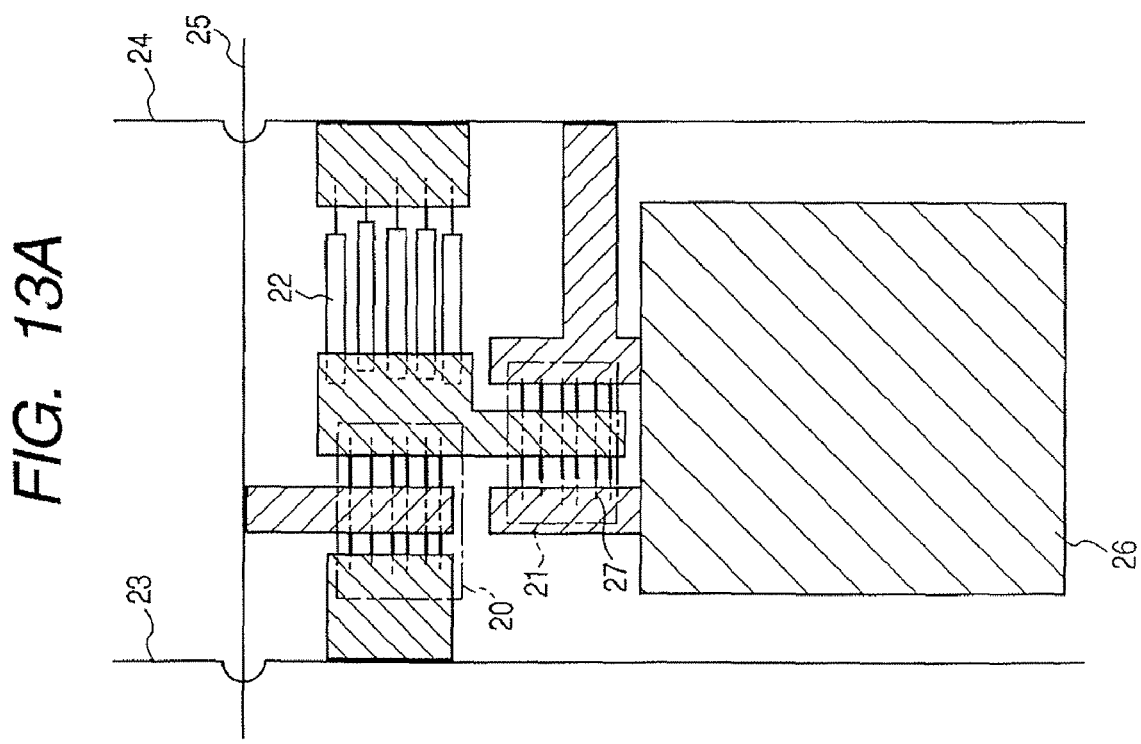
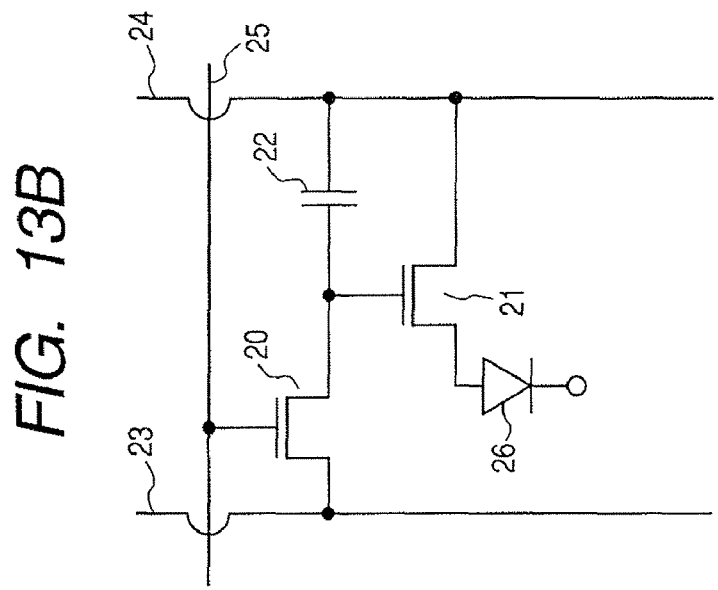
FIG. 13A
FIG. 13B

NANO-WIRE CAPACITOR AND CIRCUIT DEVICE THEREWITH

BACKGROUND OF THE INVENTION

1. Field of the Invention

The present invention relates to a nano-wire capacitor and a circuit device employing the capacitor.

2. Description of the Related Art

Recently, with progress of fine working techniques for LSI, improvement of CPU calculation speed, increase of semiconductor memory capacity, and miniaturization of electric devices are progressing remarkably rapidly. However, the patterning of the LSI is conducted by a top-down method including light exposure, the working accuracy thereof being limited to several tens of nanometers. Although scanning tunnel microscopy (STM) and atomic force microscopy (AFM) are useful for forming a several-nanometer structure, the techniques are not readily applicable to a larger-area structure. Therefore, a novel technique is necessary for higher integration of electronic circuits.

For solving the above problem, one method disclosed is use of nano-wires for the electronic circuit formation. The nano-wire is produced mainly by the bottom-up method. Therefore, the nano-wire is expected to provide a circuit at a density higher by one or more digits than that of conventional circuits provided by the top-down method. Since the size of several nano-meters is expected to give a novel effect like the quantum effect, the nano-wire has a possibility of providing, for example, a revolutionary novel device such as a super-high speed switching element utilizing the nonlinear optical characteristics of the quantum effect. Herein, the term "top-down method" is a general term for fine-processing techniques of processing a bulky material to make a product of smaller size. The term "bottom-up method" means a fine-assembling method in which such a smaller substance as the nano-wire is generated and then enlarged.

The nano-wire research includes an FET technique employing a semiconductor nano-wire. The semiconductor nano-wire FET (Field-Effect Transistor) employs a semiconductor nano-wire having high mobility of several-hundred to several-thousand $cm^2/Vs$ as the conduction channel, and is promising for finer circuits (e.g., U. S. Patent Application Publication No. 2004/0112964).

The above-mentioned semiconductor nano-wire FET can be formed by applying a dispersion of the semiconductor nano-wires in a solution to a substrate (e.g., X. Duan et al., Nature, 425 (2003) 274). This technique enables formation of a TFT (thin film transistor) of high performance in a large area at a low cost on a desired substrate. Further, the semiconductor nano-wire FET can be formed on a plastic substrate to provide a flexible high-performance TFT, which is applicable as RF-ID (radio frequency identification), a flexible display, a sheet computer, and so forth.

U.S. Patent Application Publication No. 2004/0112964 discloses an FET which employs a nano-wire constituted of semiconductor nano-wire 100 covered with dielectric layer 101 and gate electrode 102, as shown in FIG. 20. By use of the nano-wire having the above constitution in an FET, the gate electrode need not be provided additionally and the drop of the threshold level by overlapping of the nano-wires is prevented. Thereby, a semiconductor nano-wire transistor of high performance is provided through a simple process in comparison with those having a separate gate electrode.

SUMMARY OF THE INVENTION

However, in the circuit device employing the nano-wire FETs, a capacitor may be actually necessary. The inventors of the present invention noticed that, in such a circuit device, miniaturization of the circuit can be limited by the size of the capacitor.

Naturally, even if a nano-meter scale capacitor can be formed by light exposure and development by photolithography, the capacitance of a conventional capacitor having flat plates and a dielectric material sandwiched therebetween becomes smaller.

Accordingly, the inventors of the present invention have prepared a capacitor by use of a nano-wire.

The present invention provides a novel capacitor and a process for producing the capacitor.

According to an aspect of the present invention, there is provided a capacitor, comprising a first electrode comprised of an electroconductive nano-wire, a dielectric layer partly covering the peripheral face of the first electrode, and a second electrode covering the peripheral face of the dielectric layer.

The first electrode preferably has a first end portion and a second end portion, the dielectric layer covers the first end portion and the peripheral face of the first electrode between the first end portion and the second end portion, but not covering the second end portion. The second end portion of the first electrode is preferably connected electrically to an electrode comprising the structure of the capacitor.

In the capacitor, on the first electrode, the dielectric layer and the second electric layer are preferably laminated one by one, or a plurality of the dielectric layers and second electrodes are preferably laminated alternately thereon.

In the capacitor, an end face of the first electrode is preferably not covered with the dielectric layer.

According to another aspect of the present invention, there is provided a circuit device employing the capacitor, wherein a plurality of the capacitors are arranged roughly perpendicularly to a substrate comprised in the circuit device.

According to still another aspect of the present invention, there is provided a circuit device employing the capacitor, wherein a plurality of the capacitors are arranged roughly in parallel to a substrate comprised in the circuit device.

According to a further aspect of the present invention, there is provided a process for producing a capacitor, comprising the steps of forming on a substrate an electroconductive nano-wire extending roughly perpendicularly to the face of the substrate, covering the peripheral face of the nano-wire with a dielectric layer, covering the peripheral face of the dielectric layer with an electrode layer, and removing partly the dielectric layer to bare a tip of the nano-wire.

According to a further aspect of the present invention, there is provided a process for producing a capacitor on a substrate, comprising the steps of providing a member comprising a porous layer formed on the substrate and having pores perpendicular to the face of the substrate and an electroconductive nano-wire having a length larger than the thickness of the porous layer, covering the nano-wire with a dielectric layer, covering the dielectric layer with an electrode layer, and removing the porous layer.

The nano-wire capacitor of the present invention has a shape of a column, a needle, or a like steric shape, which enables a larger capacitance in comparison with the parallel plate capacitor, and will not cause decrease of the capacitance accompanied with the miniaturization of the capacitor.

Further features of the present invention will become apparent from the following description of exemplary embodiments with reference to the attached drawings.

BRIEF DESCRIPTION OF THE DRAWINGS

FIGS. 13A and 13B illustrate a current-drive type of display apparatus employing a nano-wire capacitor of the present invention.

DESCRIPTION OF THE EMBODIMENTS

First Embodiment: Capacitor Employing Nano-Wire

An embodiment of the present invention is described below in detail by reference to drawings.

Figure 1A:
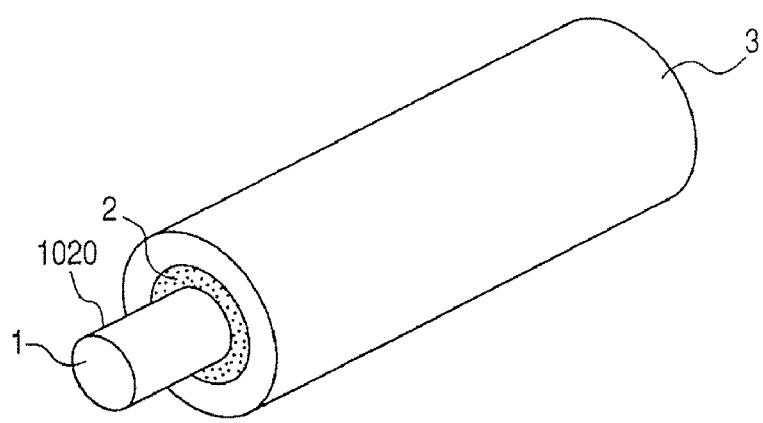
FIG. 1A is a perspective view of a nano-wire capacitor of the present invention.
Figure 1B:
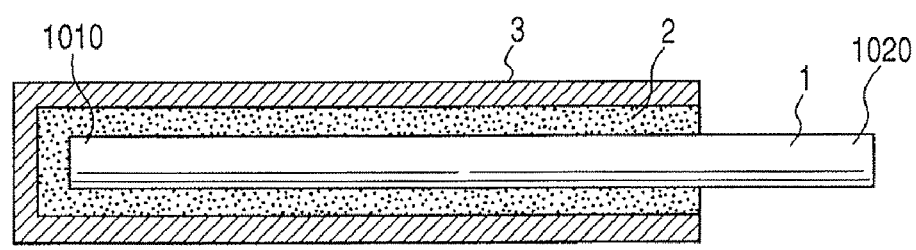
FIG. 1B is a sectional view thereof.

FIGS. 1A and 1B show an embodiment of the present invention. The nano-wire capacitor shown in FIGS. 1A and 1B comprises core electrode 1 (the first electrode in this first embodiment of the present invention), dielectric layer 2, and surface electrode 3 (the second electrode in this first embodiment of the present invention).

FIG. 1A is a perspective view, and FIG. 1B is a sectional view. In FIG. 1B, the numeral 1010 denotes the first end portion, and the numeral 1020 denotes the second end portion.

As shown in the drawing, in this embodiment, dielectric layer 2 covers the first end portion 1010, and the peripheral face of first electrode 1 between first and portion 1010 and second end portion 1020, but dielectric layer 2 does not cover second end portion 1020.

Thus, one end portion 1010 of the first electrode is covered at the periphery.

Figure 8:
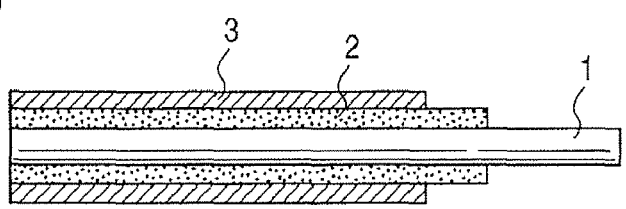
FIG. 8 is a sectional view of still another nano-wire capacitor of the present invention.

Incidentally, in FIGS. 1A to 1D, the end face of the first end portion 1010 is covered with dielectric layer 2. However, the end face need not be covered by dielectric layer 2, for example as shown in FIG. 8. In the case where second end portion 1020 of electrode 1 is not covered with dielectric layer 2, the bared portion may be covered with another material, insofar as first electrode 1 and second electrode 3 are electrically kept insulated.

Figure 5:
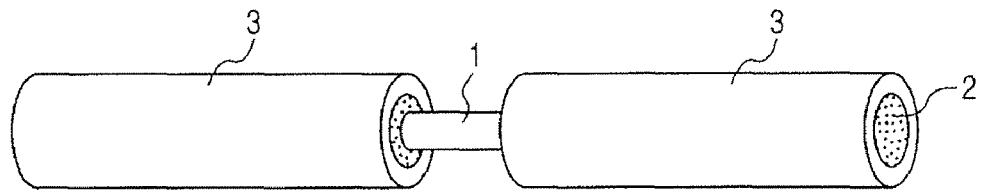
FIG. 5 is a perspective view of a nano-wire capacitor of the present invention.
Figure 9:
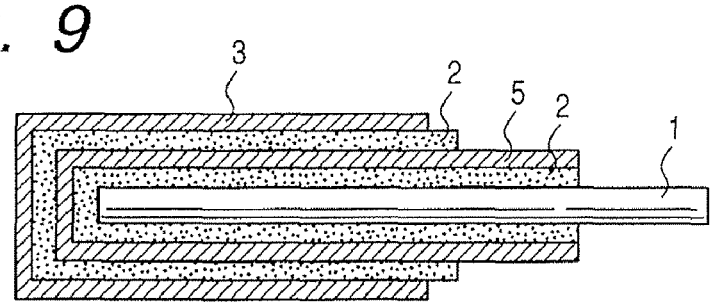
FIG. 9 is a sectional view of still another nano-wire capacitor of the present invention.
Figure 10:
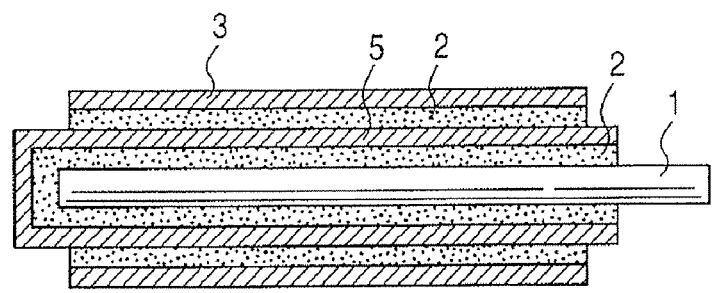
FIG. 10 is a sectional view of still another nano-wire capacitor of the present invention.

In this embodiment, the peripheral face of the first electrode is covered with the dielectric layer in a state as follows: (1) the dielectric layer covers the peripheral face except the bared portion of core electrode 1 (first electrode), and covers the end face at the other side opposite to the bared portion as shown in FIGS. 1B, 9, and 10; or (2) the dielectric layer covers the peripheral face except the bared portion of core electrode 1 as the first electrode, but does not cover the end face at the other side opposite to the bared portion as shown in FIGS. 5, and 8.

The above-mentioned nano-wire capacitor, which is constituted of an electroconductive nano-wire, a dielectric layer covering the nano-wire, and an electrode covering the periphery thereof, can be formed by a bottom-up method. This enables formation of a nano-meter-sized capacitor on a circuit without conventional light patterning, thus facilitating miniaturization of the electronic circuits. The nano-wire capacitor has a shape of a column or a needle, which enables a high capacity of the capacitor in comparison with a planar capacitor occupying the same area.

The conditions for increase of the capacitance are explained below, by taking a cylindrical capacitor as an example. The explanation below is made as to a cylindrical capacitor, but nano-wire capacitor of the present invention is not limited to the cylindrical capacitor. Depending on the process and material for the nano-wire can have a shape of a polygonal column or a needle. Such a nano-wire also can give a capacitor having a higher capacitance than a planar capacitor.

The capacitance ($C_{pl}$) of a parallel plate capacitor is represented by Equation 1 below:

$$C_{pl} = \in S/d \tag{1}$$

where $\in$ denotes the dielectric constant of the dielectric layer, S denotes the area of the electrode, and d denotes the distance between the electrodes.

On the other hand, the capacitance ($C_{cyl}$) of a core electrode is represented by Equation 2 below:

$$C_{cyl} = 2\pi \in \cdot L / \ln(b/a) \tag{2}$$

where a denotes the radius of the core electrode, b denotes the distance from the center to the surface electrode, $\in$ denotes the dielectric constant of the dielectric layer, and L denotes the length of the dielectric layer.

Therefore, the ratio $C_r = (C_{cyl}/C_{pl}) > 1$ is represented by Equation 3 below:

$$C_r = [(2\pi L)/\ln(b/a)](d/S) \tag{3}$$

When the cylindrical nano-wire capacitor and the parallel plate capacitor have respectively a dielectric layer of the same thickness (thickness d =b−a), and have the same occupation area on the base plate (major axis: L, minor axis: b), the above Equation 3 is transformed as below:

$$C_r=2\pi(1-a/b)/ln(b/a) \text{ (wherein } b/a>1) \quad (4)$$

Figure 2:
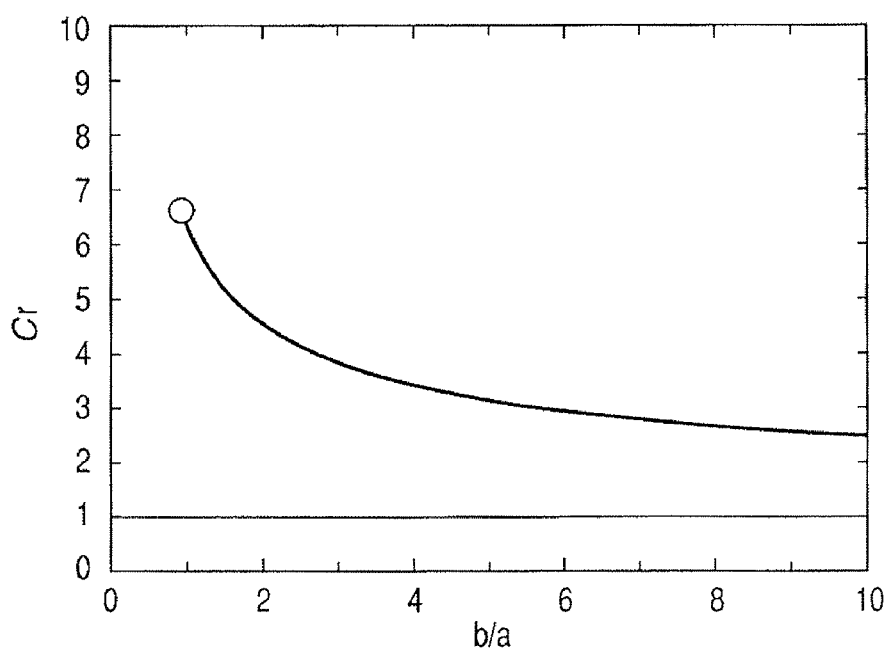
FIG. 2 is a graph showing dependence of the ratio of a capacitance of a cylindrical capacitor to a capacitance of a planar capacitor on the ratio of the major axis to the minor axis of a cylindrical nano-wire capacitor.
Figure 3A:
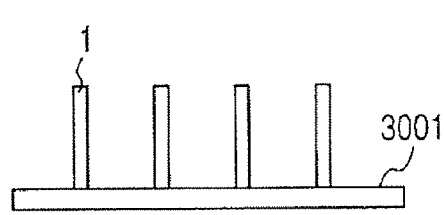
FIGS. 3A, 3B, 3C and 3D show a process for producing the nano-wire capacitor of the present invention.
Figure 3B:
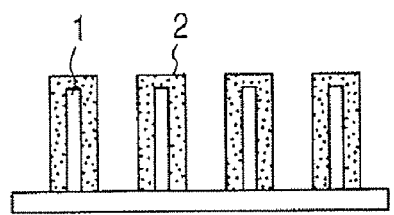
Figure 3C:
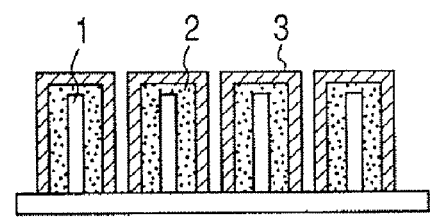
Figure 3D:
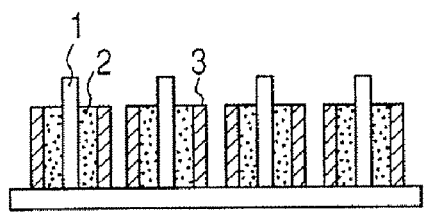

FIG. 2 shows plots of Equation 4 taking (b/a) as the abscissa. In the present invention, the cylindrical wire capacitor has a ratio of b/a ratio ranging from about 1.5 to about 3, therefore giving a capacitance higher by a factor of 4 or more than that of a parallel plate type of capacitor.

In the nano-wire capacitor of the present invention, the first electrode (electroconductive nano-wire) should be bared partly for external contact for application of a voltage between the first electrode and the second electrode. For a higher capacitance of the nano-wire capacitor, the bared volume of the first electrode is preferably minimized to increase the volume for the charge storage portion. The nano-wire capacitor of the present invention is preferably bared at one end of the electroconductive nano-wire to enlarge the area for storing the electric charge for effective charge storage. Further, the dielectric layer may be divided into portions in the nano-wire capacitor length direction to constitute capacitors having at least one common electrode on the one nano-wire.

Furthermore, for higher capacitance, the nano-wire capacitor of the present invention may be constituted of a first electrode composed of an electroconductive nano-wire; a first dielectric layer and a second electrode layer laminated one by one or two or more layers of the first dielectric layers and the second dielectric layers laminated alternately with the first electrode partly bared; and a third electrode formed on the periphery of the second electrode with interposition of the second dielectric layer.

Figure 22:
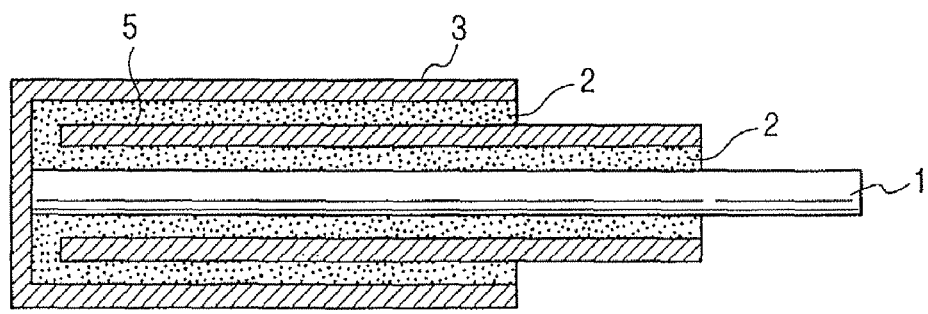
FIG. 22 is a sectional view of a nano-wire capacitor of the present invention.
Figure 23:
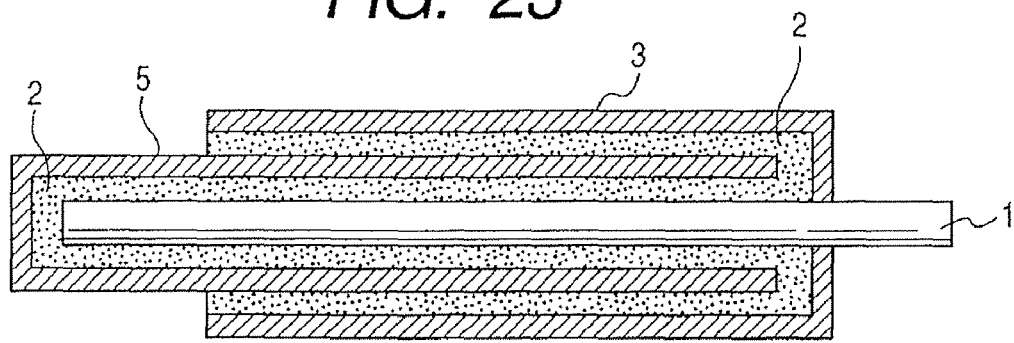
FIG. 23 is a sectional view of another nano-wire capacitor of the present invention.

A lamination type capacitor, as shown in FIG. 9 or FIG. 10, enables formation of plural parallel capacitors on a single nano-wire to increase the capacitance of the nano-wire capacitor for increase of charge storage. Further, by connection of the first electrode with the third electrode as shown in FIGS. 22 and 23, the electrode area is increased for providing a higher capacitance of the nano-wire capacitor.

A circuit device can be constituted by placing the nano-wire capacitors of the present invention to be roughly perpendicular to or roughly parallel to a substrate. (Herein, the term "roughly perpendicular to" or "roughly parallel to" signifies that the circuit device is inclined slightly but is considered to be substantially perpendicular or parallel to the substrate. In particular, a circuit containing the nano-wire capacitors arranged on a substrate roughly parallel to the substrate can readily be formed by applying a dispersion of the nano-wire capacitors in a solvent onto the substrate, and arranging the nano-wire capacitors on the substrate. Otherwise, the nano-wire capacitor of the present invention may be formed on a substrate other than the substrate of the electronic circuit, and heat-treated to prepare a finer dielectric layer. Thereby a high-quality capacitor can be produced. With such a technique, a capacitor can be formed on an intended substrate at a lower cost in a larger size of the elements. The element can be made flexible by forming the element on a plastic substrate.

(Core Electrode (First Electrode))

Core electrode 1 may be made from any electroconductive nano-wire or nano-tube of a material such as metals, highly doped semiconductors, and electroconductive oxides. A preferred one is silicon whisker. The electroconductivity of the silicon whisker can be increased by doping with phosphorus or boron.

The nano-wire has a diameter ranging preferably from several nanometers to hundreds of nanometers. Specifically, the diameter of the nano-wire ranges from 2 nm to 500 nm, preferably from 5 nm to 300 nm, more preferably from 5 nm to 50 nm.

The aspect ratio of the nano-wire is suitably selected over the range from a rod shape to a wire shape. Specifically, the length ranges preferably from tens of nanometers to hundreds of micrometers. Specifically the length of the nano-wire ranges from 10 nm to 500 nm.

The nano-wire is produced preferably by growing the nano-wire perpendicularly to a substrate for facilitating the subsequent coverage with dielectric layer 2 or surface electrode 3. Specifically the process is selected preferably from gas phase processes such as CVD (chemical vapor deposition) and VLS (vapor liquid solid); and electrochemical processes such as electric field deposition.

(Dielectric Layer)

Dielectric layer 2 may be formed from any insulating material having preferably a higher dielectric constant and a lower electroconductivity. The material includes inorganic oxides and nitrides such as silicon oxide, silicon nitride, aluminum oxide, titanium oxide, and tantalum oxide; and organic polymers such as polyacrylates, polymethacrylates, polyethylene terephthalate, polyimides, polyethers, and siloxane-containing polymers. The process of formation of dielectric layer 2 is not limited: The dielectric layer may be formed on the peripheral face of the core electrode by a gas-phase process such as vapor deposition and sputtering, or a liquid-phase process. The thickness of dielectric layer 2 ranges preferably from about one nanometer to tens of nanometers, but is not limited thereto.

(Second Electrode)

Surface electrode 3 may be formed from any electroconductive material. The material includes metals, highly doped semiconductors, and electro-conducting oxides. The process of formation of surface electrode 3 is not limited. The surface electrode may be formed on the peripheral face of the core electrode by a gas-phase process such as vapor deposition and sputtering, or a liquid-phase process. The thickness of surface electrode 3 ranges preferably from about one nanometer to tens of nanometers, but is not limited thereto.

In this embodiment, the resistivity ($\Omega$m) of first electrode 1 or second electrode 3 is not higher than $10^{-4}$, preferably not higher than $10^{-5}$ more preferably not higher than $10^{-6}$.

Incidentally, the semiconductor nano-wire disclosed in the aforementioned Patent Document 1 is intended for use for TFT as core portion 100 (FIG. 20) serving as a channel region. Therefore, a highly electroconductive material of a high carrier concentration is not used as the core portion. The core portion of a low carrier concentration is not useful as the electrode of a capacitor. A capacitor employing such a core portion as the electrode cannot have a high capacitance.

Further, in the above semiconductor nano-wire for the TFT, the both end portions of core 100 are bared for electrical connection with a source electrode and a drain electrode. Therefore, in use as a capacitor, the charge storage portion is decreased, and a third electrode is necessary additionally.

In the above embodiment, the core electrode is bared at one end portion of the nano-wire capacitor. Otherwise, core electrode 1 may be bared at the middle portion of the nano-wire capacitor as shown in FIG. 5. Namely, the capacitor of the present invention is comprised of the first electrode comprised of a conductive nano-wire, the dielectric layer covering partly the peripheral face of the first electrode and the second electrode covering the peripheral face of the dielectric layer. The region of the first electrode not covered with the dielectric layer may consist of either one tip of the first electrode or such an intermediate part in the direction of longitudinal direction of the electrode as shown in FIG. 5.

Figure 6:
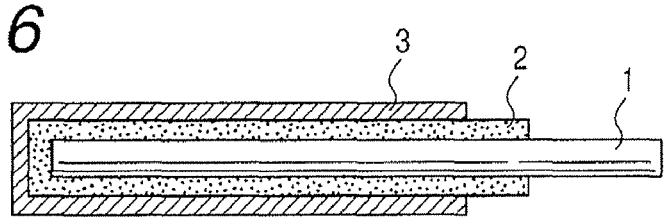
FIG. 6 is a sectional view of a nano-wire capacitor of the present invention.
Figure 7:
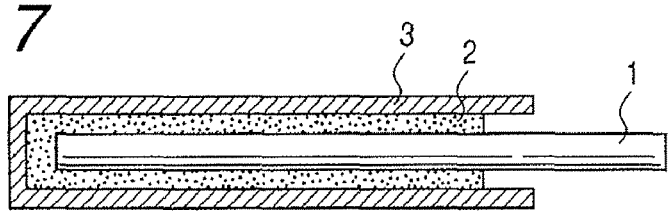
FIG. 7 is a sectional view of another nano-wire capacitor of the present invention.

The bared portion of the core electrode, other than that shown in FIGS. 1A to 1D, may take various shapes. The bared end portion may be stepped as shown in FIGS. 6 and 7. In FIG. 6, dielectric layer 2 is bared, while in FIG. 7, the dielectric layer retracts not to be exposed. The face of the other end of core electrode 1 opposite to the bared end portion may be exposed as shown in FIG. 8.

The nano-wire capacitor may be made in a lamination structure by providing internal electrode 5 as shown in FIG. 9 or FIG. 10 to increase the capacitance. In FIGS. 9 and 10, one dielectric layer and one internal electrode are additionally provided, whereas two or more respectively of the internal electrodes and the dielectric layers may be provided alternately. With the constitution shown in FIGS. 9 and 10, internal electrode 5 may be employed as one electrode of the capacitor and core electrode 1 and surface electrode 3 may be connected to serve as the other electrode of the capacitor for higher capacitance. In another capacitor, as shown in FIGS. 22 and 23, internal electrode 5 is employed as one electrode and core electrode 1 and surface electrode 3 are connected to serve as the other electrode. Otherwise, with a constitution in which two or more respectively of the internal electrodes and the dielectric layers are provided alternately, odd internal electrode layers are commonly connected as one electrode of the capacitor and the core electrode and even internal electrode layers are commonly connected as the other electrode of the capacitor to obtain higher capacitance. The common connection may be made outside as shown in FIGS. 9 and 10, or may be made inside the element as shown in FIGS. 22 and 23.

Figure 11:
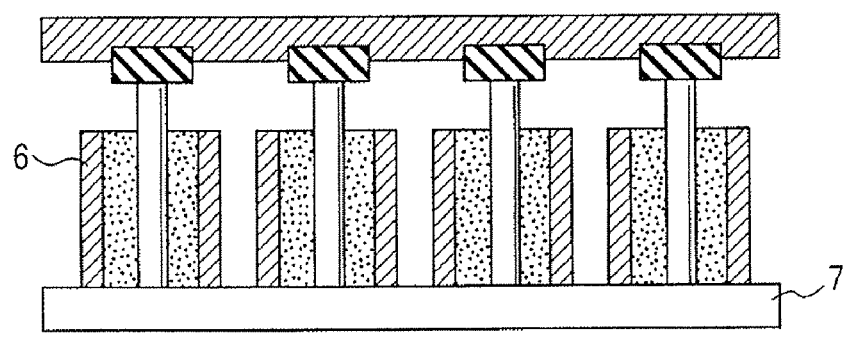
FIG. 11 illustrates a circuit device employing a nano-wire capacitor of the present invention.
Figure 12:
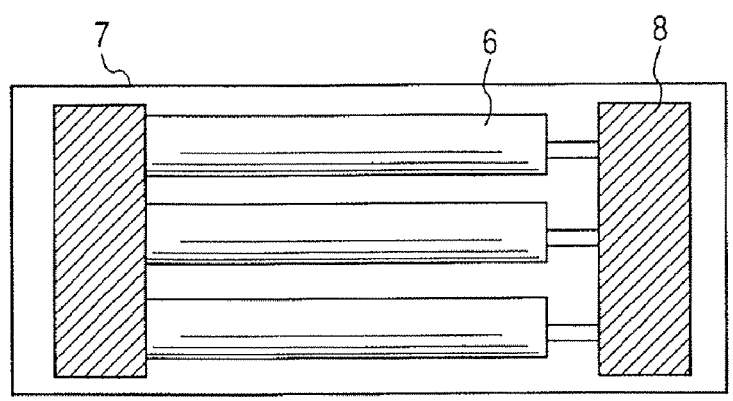
FIG. 12 illustrates another circuit device employing a nano-wire capacitor of the present invention.

In use of the nano-wire capacitors of the present invention, typified by this embodiment, in a circuit device wired on a substrate, the nano-wire capacitors 6 may be arranged perpendicularly to substrate 7 as shown in FIG. 11, or may be arranged parallel to substrate 7 and held between electrodes 8 as shown in FIG. 12. For use as shown in FIG. 12, the nano-wire capacitors can be arranged in the circuit by application of a liquid dispersion of the nano-wire capacitors in a solvent. Thereby, the capacitors can be formed in a nano-meter scale by a simple process. In the above technique, since heat treatment is not necessary for capacitor formation, the circuit may be formed on various kinds of substrates. For example, a flexible circuit device is provided by forming the circuit on a plastic substrate, whereby novel types of circuit devices can be provided, such as flexible displays and sheet computers.

A circuit having a semiconductor nano-wire transistor combined with the nano-wire capacitor typified by this embodiment of the present invention achieves simultaneously a high mobility of the semiconductor nano-wire transistor and a high capacitance of the nano-wire capacitor in one and the same electronic circuit. This enables high density of the electronic circuit not achievable by conventional light exposure technique, and enables also formation of electronic circuit having a high performance on a desired substrate. Therefore, the technique of the present invention is industrially highly effective.

An example of the circuit device having the nano-wire capacitor and the semiconductor nano-wire transistor is a display apparatus driven by an active matrix, and DRAM (dynamic random access memory).

When the nano-wire capacitor of this embodiment of the present invention is used, for example, in the above display apparatus, the combination of the nano-wire capacitor of the present invention and the semiconductor nano-wire transistor enables formation of a high-performance TFT circuit on a desired substrate. Thereby, the display apparatus can be made flexible, the display area can be made larger, and the production cost can be reduced. In particular, the semiconductor nano-wire transistor has a high mobility, and is effective in application to an organic EL display element. Thus the present invention enables a larger area of the display screen of an organic EL display apparatus. Thereby a sheet-shaped large-area display which has not been produced by the conventional techniques can be produced.

Application of the nano-wire capacitor of this embodiment of the present invention to DARM enables higher density and higher capacitance of the electronic circuit than that produced by conventional light exposure technique. Further the electronic circuit employing the nano-wire capacitor of the present invention can be formed on any desired substrate, which enables production of a sheet-shaped large-area DRAM at a lower cost. Therefore, the electronic circuit employing the nano-wire capacitor of the present invention enables production of a DRAM having a large capacitance by the higher density and larger area of the element.

Figure 21:
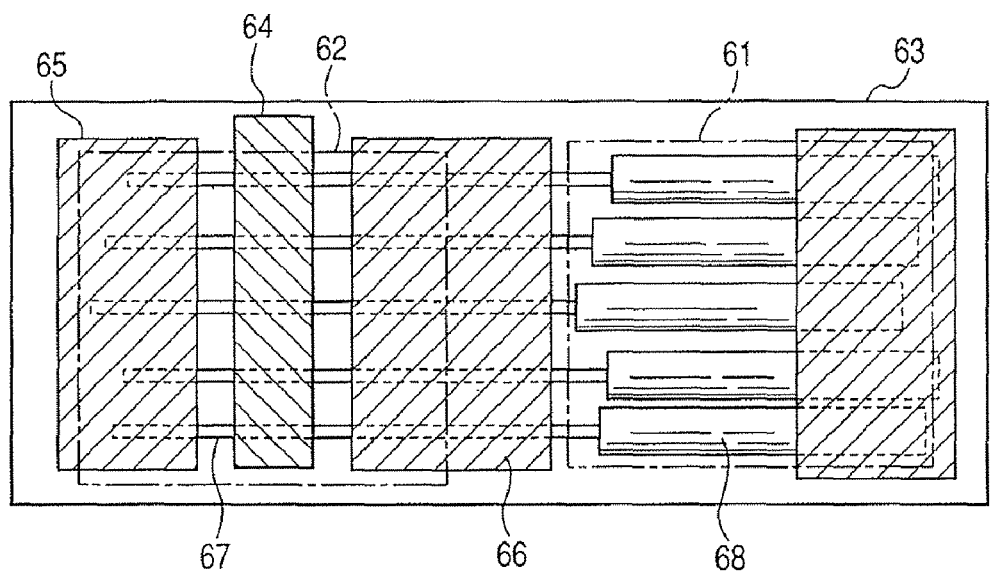
FIG. 21 illustrates an electric element employing a nano-wire capacitor of the present invention.

The nano-wire capacitor of the present invention may be formed in a constitution in which a transistor and a capacitor are formed on one and the same nano-wire as shown in FIG. 21 as an example. With such a constitution, transistors and capacitors are collectively formed on an element, enabling production of an electronic element in a simple constitution through a simple production process. In this constitution, the composition of the nano-wire may be changed between the transistor portion and the capacitor portion, wherein the electro-conductivity is made higher at the portion corresponding to the capacitor core electrode than at the portion corresponding to the transistor channel. In a specific example, a semiconductor nano-wire as the above nano-wire is doped less at the transistor portion and doped more at the capacitor portion.

Application of the nano-wire capacitor typified by this embodiment of the present invention to an active-matrix-drive type display apparatus is explained below in detail.

(1) Application to Current-Drive Type Display Apparatus

In driving of a current-drive type display apparatus, electric current is made to flow through the picture element during one frame period and the driving transistor is kept turned on therefor by a transistor and a capacitor for switching. Therefore, for the driving, the current-drive type display apparatus has at least two transistors in respective picture elements: a switching transistor for writing a current in a capacitor of a picture element, and a driving transistor for supplying electric current to a display element such as an organic EL and an inorganic LED. A nano-wire capacitor of this embodiment of the present invention is provided as the capacitor.

Figure 14:
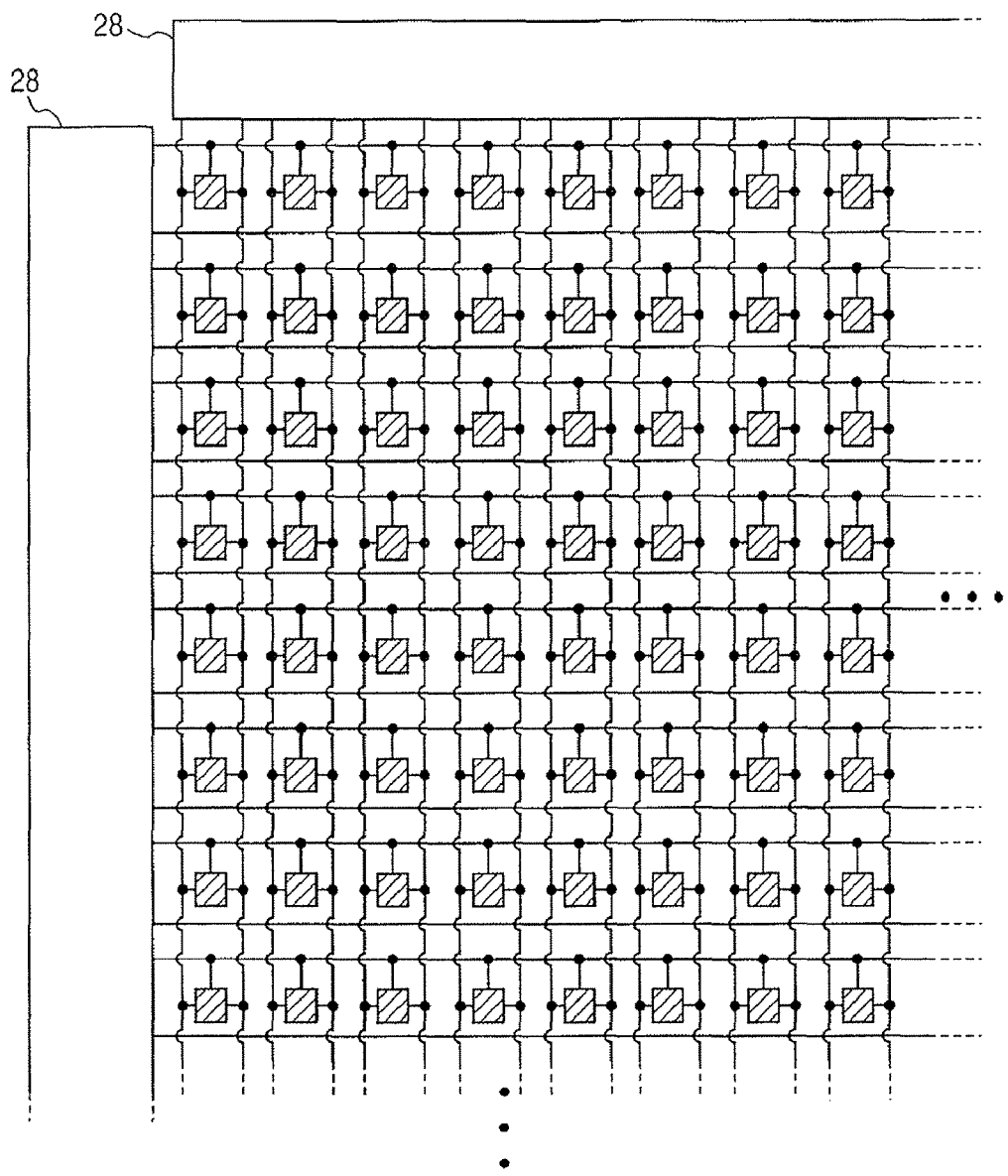
FIG. 14 illustrates another current-drive type of display apparatus employing nano-wire capacitors of the present invention.

FIGS. 13A and 13B and FIG. 14 show examples of the electronic circuit having a nano-wire capacitor of the present invention installed in a current-drive type display apparatus. FIG. 13A is an enlarged view of one picture element of the display apparatus. FIG. 13B is a circuit diagram of the picture element of FIG. 13A. FIG. 14 shows display elements having arrangement of plural elements. In FIG. 14, the respective picture elements are shown simply as a block.

The above-mentioned current-drive type display apparatus comprises at least nano-wire transistor 20 for switching, nano-wire transistor 21 for driving, nano-wire capacitor 22, data line 23, power-feeding line 24, scanning line 25, display part 26, and driving circuit 28. Display part 26 is an EL element. Driving nano-wire transistor 21 and switching nano-wire transistor 20 have respectively plural semiconductor nano-wires 27.

Figure 15:
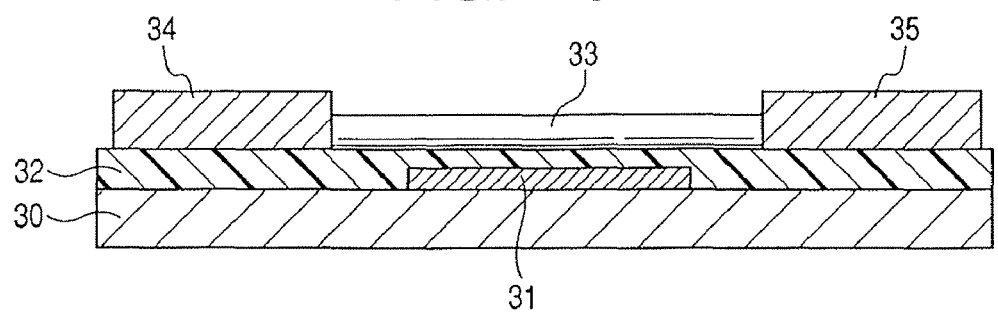
FIG. 15 is a sectional view of a semiconductor nano-wire transistor.
Figure 16:
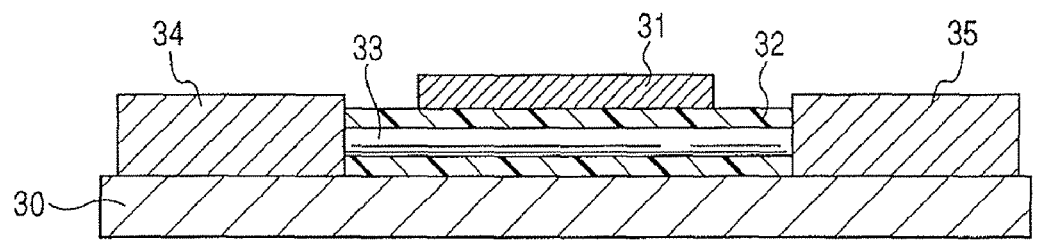
FIG. 16 is a sectional view of another semiconductor nano-wire transistor.
Figure 20:
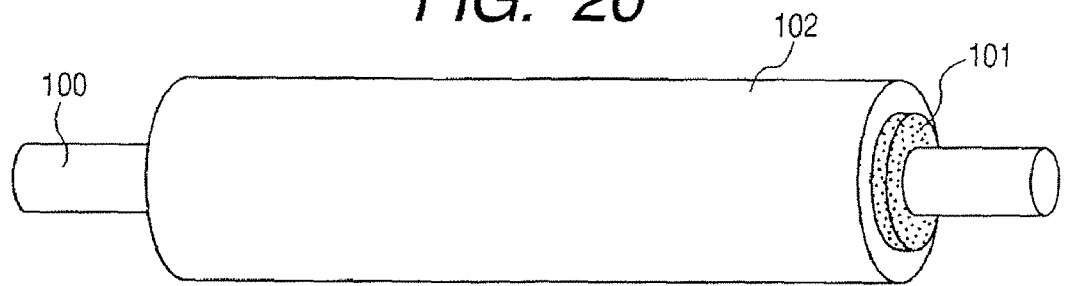
FIG. 20 illustrates a constitution of an FET employing a semiconductor nano-wire.

Switching nano-wire transistor 20 and driving nano-wire transistor 21 are respectively a field effect transistor employing a semiconductor nano-wire as the channel. FIG. 15 shows the constitution thereof. In this structure, gate electrode 31 is formed on substrate 30; gate-insulating layer 32 is formed thereon, semiconductor nano-wire 33 is arranged thereon; and source electrode 34 and drain electrode 35 are respectively connected to the ends of the nano-wire. In another constitution of the transistor, as shown in FIG. 16, the semiconductor nano-wire is coated with a gate-insulating layer and gate electrode 31 is provided thereon without additional gate insulating layer. In preparation of this constitution, after formation of the insulating layer on the semiconductor nano-wire, wires are placed thereon, and the insulating layer is removed at the end portions by use of a mask covering the entire portion except the end portions, and then a source electrode and a drain electrode are formed on the end portions. Otherwise, the ends of the semiconductor nano-wire may be bared by combination of processes of FIGS. 3A to 3D and FIGS. 4A to 4D. In the case where plural nano-wire are used as conducting channels, the threshold level of a nano-wire transistor can be improved by use of a nano-wire having a gate electrode thereon as shown in FIG. 20 for keeping the applied gate voltage constant.

The material for nano-wire 27 includes compound semiconductors such as II-IV group compound semiconductors, III-V group compound semiconductors, I-V group compound semiconductors, I-VI group compound semiconductors, I-VII group compound semiconductors, II-V group compound semiconductors, II-VII group compound semiconductors, III-VI group compound semiconductors, and IV-IV group compound semiconductors; and VI group semiconductors. Specific examples of the material includes Si, Ge, SiGe, AlGaAs, ZnO, ZnS, ZnSe, ZnTe, CdS, CdSe, CdTe, GaAs, GaN, GaAs, GaP, InP, InN, InAs, and carbon nano-tube. Switching nano-wire transistor 20 and driving nano-wire transistor 27 may be formed from the same material, or formed from different materials. The semiconductor nano-wire is preferably synthesized by a CVD process or a VLS process, but is not limited thereto. Among the processes, the VLS process is preferred in view of the narrow diameter distribution and uniform length of the nano-wires.

Regarding the number of semiconductors 27 in a transistor, since driving nano-wire transistor 21 should allow a larger amount of electric current to flow through display element 26, preferably a larger number of the semiconductor nano-wires are incorporated therein. Therefore, semiconductor nano-wires are preferably incorporated in a larger number in driving nano-wire transistor 21 than in the switching nano-wire transistor. The semiconductor transistor is preferably passivated in order to prevent exfoliation of the semiconductor nano-wire and the nano-wire capacitor from the substrate.

In the process for producing the display apparatus, semiconductor nano-wire 27 and nano-wire capacitor 22 are applied in a state of solvent dispersion. Such a process enables formation of a transistor and a capacitor on a desired substrate and cost reduction of the display apparatus. A flexible display apparatus can be produced by use of a plastic substrate. In particular, the use of the nano-wire capacitor of the present invention and the nano-wire transistor enables a high mobility and a large area of the display apparatus, enabling also production of a large-area organic EL display apparatus which has not been achieved by conventional techniques. In the above explanation, the picture element is constituted by combination of the nano-wire capacitor of the present invention and nano-wire transistor. However, the picture element can naturally be constituted by combination of the nano-wire capacitor of the present invention and conventional thin film transistor.

(2) Application to Voltage-Drive Type Display Apparatus

In voltage-drive type display method including liquid display apparatus and electrophoresis type display apparatus, since the display portion is controlled only by turning-on and turning-off of the voltage, only one transistor is enough for one picture element, being different from the aforementioned current-drive type display apparatus. For giving a memory capacity, a capacitor is provided in each picture element similarly as in the aforementioned current-drive type display apparatus. As the capacitor, the nano-wire capacitor typified by this embodiment of the present invention is employed.

Figure 17:
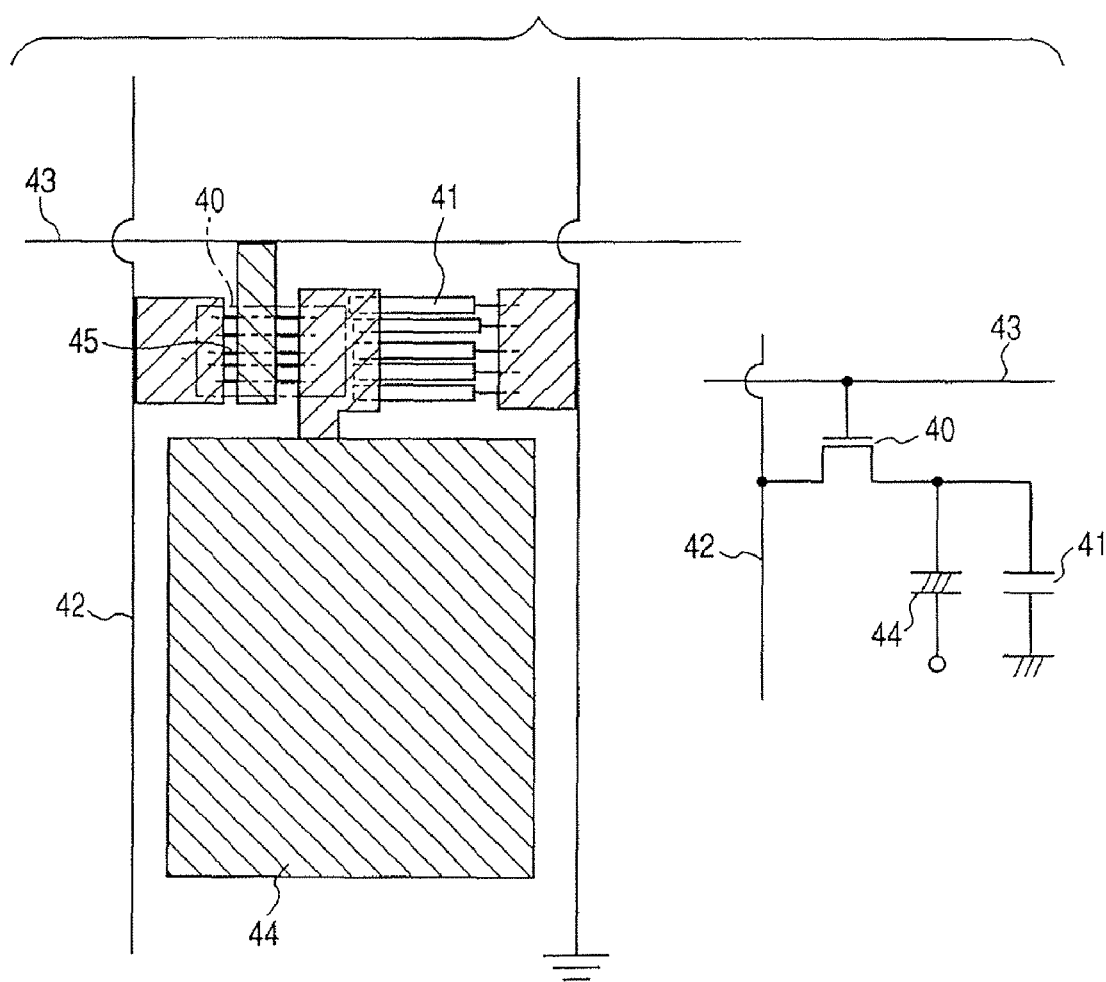
FIG. 17 illustrates a voltage-drive type of display apparatus employing nano-wire capacitors of the present invention.

FIG. 17 shows a constitution of one picture element of a voltage-drive type display apparatus employing a nano-wire capacitor of the present invention. The voltage-drive type display apparatus comprises at least driving nano-wire transistor 40, nano-wire capacitor 41, data line 42, scanning line 43, display portion 44. Display portion 44 is a liquid crystal element which is constituted of a picture element electrode, a counter electrode and a liquid crystal layer held between the electrodes. In FIG. 17, display portion 44 shows the picture element electrode. Driving nano-wire transistor 40 has semiconductor nano-wire 45.

Driving nano-wire transistor 40 is a field effect transistor employing a semiconductor nano-wire as the channel, having the same constitution as the nano-wire transistor of the above current-drive type display apparatus. FIG. 17 shows only one picture element. A display apparatus is constituted by arranging plurality of the picture elements and connecting thereto driving circuits similarly as in FIG. 14. This display apparatus, similarly as the current-drive type display apparatus, is preferably subjected to passivation in order to prevent exfoliation of the semiconductor nano-wire and the nano-wire capacitor from the substrate.

In the process for production of the above-mentioned display apparatus, similarly as in production of the current-drive type display apparatus, a transistor and a capacitor can be formed on a desired substrate without a vacuum process. Such a process reduces the production cost of the display apparatus. The display apparatus can be made flexible by use of a plastic substrate. The voltage-drive type TFTs are simpler than current-drive type TFTs in the circuit constitution and production process.

Figure 18:
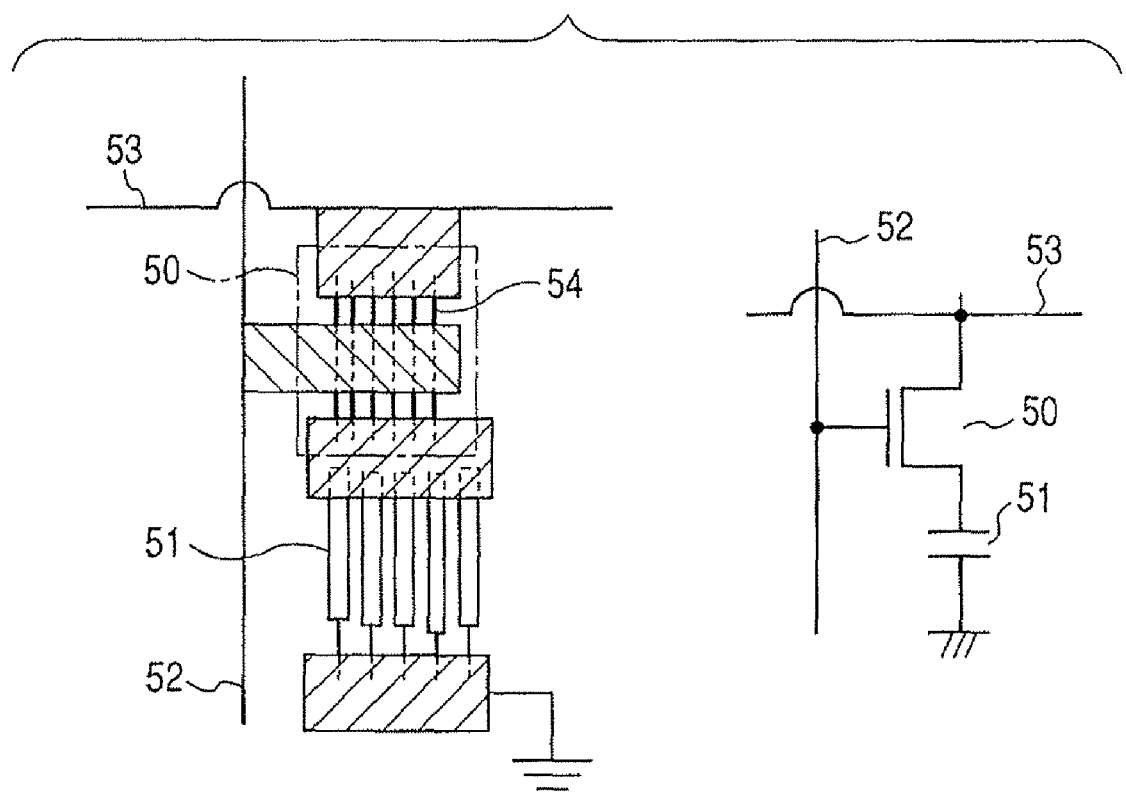
FIG. 18 illustrates a DRAM employing nano-wire capacitors of the present invention.
Figure 19:
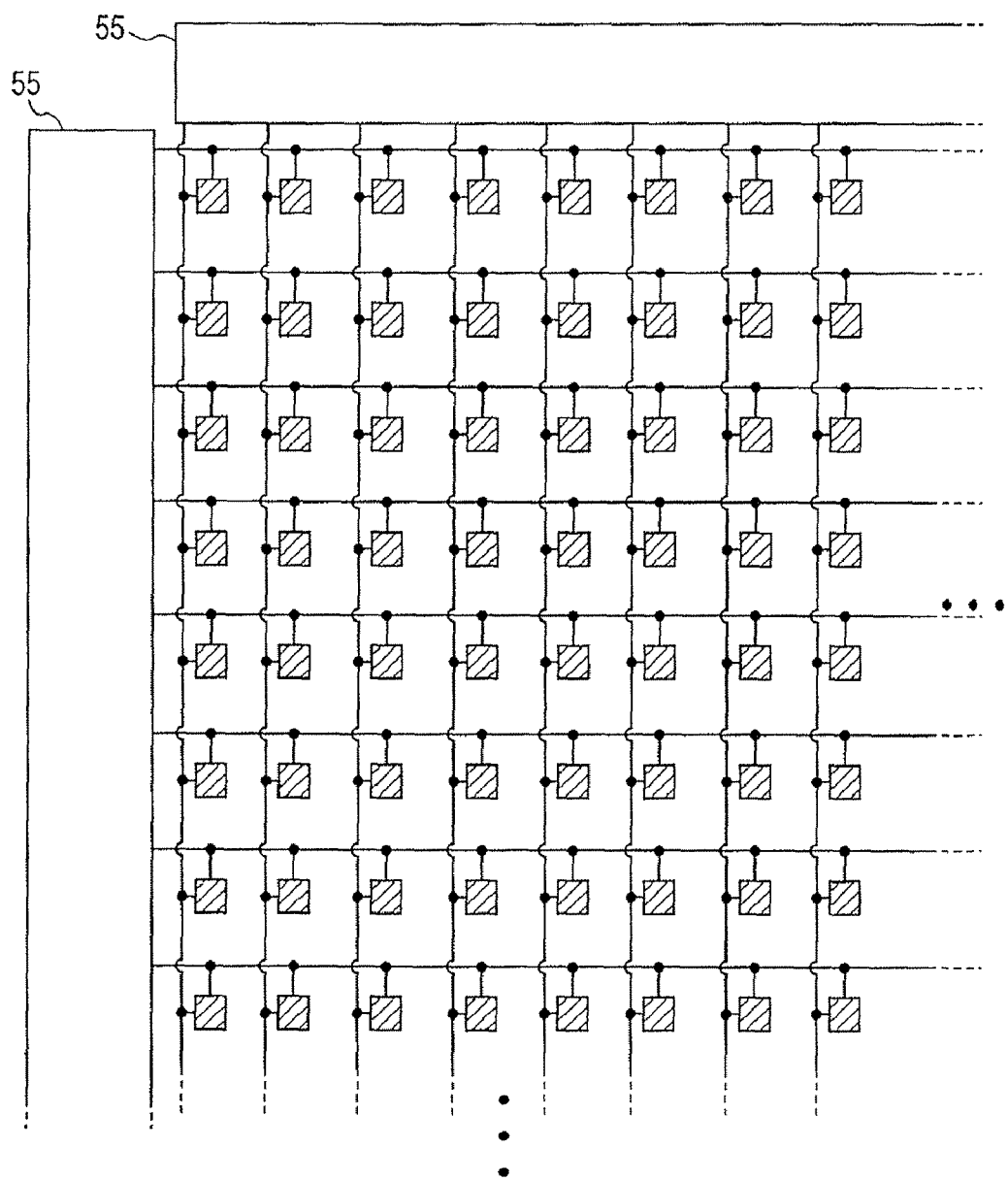
FIG. 19 illustrates another DRAM employing nano-wire capacitors of the present invention.

Application of a nano-wire capacitor typified by this embodiment of the present invention to DRAM is explained below in detail. DRAM is a memory element having a circuit constituted of a transistor and a capacitor for storing electric charges. FIG. 18 and FIG. 19 show an example of a DRAM employing semi-conductor nano-wire transistors and nano-wire capacitors. FIG. 18 is an enlarged view of one cell of the DRAM. FIG. 19 shows arrangement of the cells. In FIG. 19, respective cells are represented simply by a block.

The DRAM comprises semiconductor nano-wire transistor 50, nano-wire capacitor 51, word line 52, bit line 53, and driving circuit 55. Semiconductor nano-wire transistor 50 has semiconductor nano-wire 54. The DRAM stores data by storing electric charge in the capacitor of the respective cells through the word lines and the bit lines. Semiconductor nano-wire transistor 50 may be the same as the one employed in the aforementioned display apparatus.

The semiconductor nano-wire and nano-wire capacitor of the DRAM are preferably passivated for prevention of exfoliation.

The semiconductor nano-wire and nano-wire capacitor of the DRAM have diameters of not larger than tens of nanometers. Therefore, the density of the circuit can be increased for higher memory capacity in comparison with a DRAM produced by a conventional light-exposure process. Further, the coating step in the DRAM production process enables formation of transistors and capacitors without employing a vacuum process on a desired substrate. Therefore, the cost of the DRAM can be reduced and the elements can be formed in a large area. Thereby, a DARM having a large capacitance which has not been achieved can be produced owing to the large element area and high density of the elements. A flexible DRAM can be produced by use of a plastic substrate for new application such as a sheet computer.

Second Embodiment: Process for Production of Capacitor Having Nano-Wire

The aforementioned capacitor using a nano-wire can be formed, for example as shown in FIGS. 3A to 3D, through steps of formation of core electrodes 1, dielectric layers 2, and surface electrode 3, and a subsequent step of etching of dielectric layers 2 and surface electrodes 3.

The process is explains specifically by reference to FIG. 3. Firstly on substrate 3001, electroconductive nano-wires 1 are formed to be roughly perpendicular to the substrate face (FIG. 3A). The peripheral faces of nano-wires 1 are covered with dielectric layer 2 (FIG. 3B). The peripheral faces of dielectric layers 2 are covered with electrode layer 3 (FIG. 3C). Then, the dielectric layers are partly removed to bare the tip portions of the nano-wires (FIG. 3D). If necessary, the nano-wires are separated from the substrate.

Figure 4A:
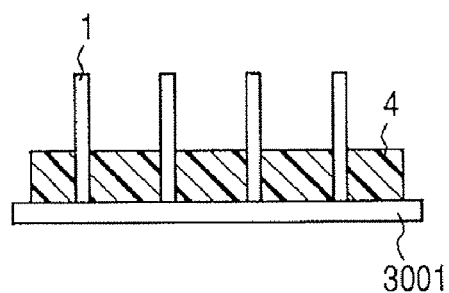
FIGS. 4A, 4B, 4C and 4D show a process for producing another nano-wire capacitor of the present invention.
Figure 4B:
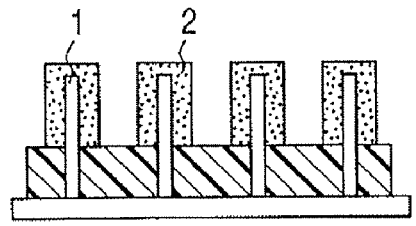
Figure 4C:
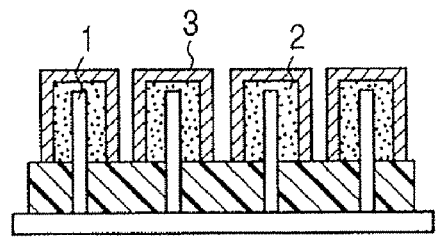
Figure 4D:
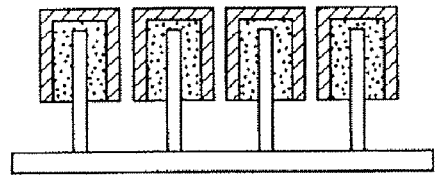

In another process, the capacitor can be produced through the steps shown in FIGS. 4A to 4D. Specifically a member is provided which has substrate 3001, porous layer 4 having pores perpendicular to the substrate face, and electroconductive nano-wires 1 extending through the pores of the porous layer outside to be longer than the thickness of the porous layer (FIG. 4A). Then dielectric layers 2 are formed to cover nano-wires 1 (FIG. 4B). Surface electrodes 3 are formed thereon (FIG. 4C). Finally, porous layers 4 are removed (FIG. 4D). The material of the porous layer includes a porous material containing anodized alumina (Japanese Patent Application Laid-Open No. 2000-031462), and porous silicon or silicon oxide (Japanese Patent Application Laid-Open No. 2004-237430). The nano-wire can be grown by VLS or a like method with catalyst fine particles (Au or the like) placed on the bottoms of the pores of the porous layer.

In the drawings, reference numerals denote the members as follows: 1, a core electrode; 2, a dielectric layer: 3, a surface electrode; 4, a porous layer; 5, internal electrode; 6, a nano-wire capacitor; 7, a substrate; 20, a switching nano-wire transistor; 21, a driving nano-wire transistor; 22, a nano-wire capacitor; 23, a data line; 24, a power supply line; 25, a scanning line; 26, a display part; 27, a semiconductor nano-wire transistor; 28 a driving circuit); 30, a substrate; 31, a gate electrode; 32, a gate-insulating layer; 33, a semiconductor nano-wire; 34, a source electrode; 35, a drain electrode; 40 a driving nano-wire transistor; 41, a nano-wire capacitor; 42, a data line; 43, a scanning line; 44, a display part; 45, a semiconductor nano-wire; 50, a semiconductor nano-wire transistor; 51, a nano-wire capacitor; 52, a word line; 53, a bit line; 54, semiconductor nano-wire; 55, a driving circuit; 61, a capacitor part; 62, a transistor part; 63, a gate insulating layer; 64, a gate electrode; 65, a source electrode; 66, a drain electrode; 67, nano-wire; 68, surface electrode; 100, a semiconductor nano-wire; 101, a dielectric layer; and 102, a gate electrode.

EXAMPLES

Example 1

A nano-wire capacitor is produced as shown below. Core electrode 1 is constituted of a Si nano-wire highly doped with B; dielectric layer 2 is formed from silica; and surface electrode 3 is formed from Au. The Si nano-wire is prepared by a VLS method.

The Si nano-wire is prepared through steps shown in FIGS. 3A to 3D. On a Si substrate, fine gold particles of 15-20 nm diameter are deposited. This substrate is heated in an atmosphere of $SiH_4$ and $B_2H_6$ at 450° C. to grow nano-wires. The formed nano-wires contain B as a dopant at a content of 0.5% mol, and have a diameter of about 15-20 nm, and a length of 30-50 μm. The resulting Si nano-wire is oxidized on the surface to form a silica coating film. Thereon, Au surface electrodes are formed by vapor deposition. The end portions of the core electrodes are bared to obtain the nano-wire capacitor of this Example.

Example 2

An organic EL display apparatus is produced with the nano-wire capacitor prepared in Example 1 and a semiconductor nano-wire FET. The nano-wire capacitors prepared in Example 1 are taken out from the substrate ultrasonically and dispersed in solvent ethanol.

On the other hand, the semiconductor nano-wire for the semiconductor nano-wire FET is prepared by a VLS method in a similar manner as in preparation of the core electrode in Example 1. The prepared Si nano-wires contain B at a content of 0.01% mol. The surface of the nano-wire is oxidized to form gate-insulating layers. The semiconductor nano-wires are separated from the substrate ultrasonically and are dispersed in solvent ethanol in the same manner as the above nano-wire capacitors.

The display apparatus of this Example has a constitution shown in FIGS. 13A, 13B and 14, comprising switching nano-wire transistors, driving nano-wire transistors, nano-wire capacitors, data lines, power supply lines, scanning lines, organic EL elements as display elements, and driving circuits.

In production of the display apparatus, firstly, wirings of a data lines, power supply lines, scanning lines, and so forth are formed by vapor deposition of Au. Then semiconductor nano-wires for the switching nano-wire transistors and for driving nano-wire transistors are formed by coating application, and are passivated with a UV-setting resin to prevent exfoliation from the substrate to form transistors. Then the above nano-wire capacitors are applied and arranged by coating on the TFTS, and the nano-wire capacitors are passivated with a UV-setting resin to complete the capacitors on the TFTs.

In the formation of the organic EL element, a positive electrode is formed from ITO, a positive hole-transporting layer is formed from PEDOT/PSS, a light-emitting layer is formed from poly[2-methoxy-5-(2'-ethyl-hexyloxy)-1,4-phenylene vinylene] (MEH-PPV), and the negative electrode is formed from Ca/Al. The positive hole-transporting layer, and the light-emitting layer are patterned by an ink-jet method, the ITO is formed by sputtering, and the Ca/Al is formed by vapor deposition. Finally, a driving circuit is connected to the element to complete the display apparatus.

The organic EL element formed by the above process achieves high efficiency owing to the high mobility of the nano-wire transistor, enabling a larger electric current to flow through the elements. Further, the organic EL element display apparatus having a large screen can be produced at a low cost since the transistors and the capacitors can be formed without a vacuum process owing to the capacitors employing nano-wires.

Example 3

A DRAM is produced by use of the nano-wire capacitors prepared in Example 1 and semiconductor nano-wire FETs.

The nano-wire capacitors prepared in Example 1 are separated from the substrate by ultrasonic wave and are dispersed in solvent ethanol.

On the other hand, the semiconductor nano-wire for the semiconductor FET is prepared by a VLS method in a similar manner as in preparation of the core electrode in Example 1. The nano-wire is composed of Si containing B at a content of 0.01% mol. The surface of the nano-wire is oxidized to form a gate-insulating layer. The semiconductor nano-wires are separated from the substrate ultrasonically and dispersed in solvent ethanol in the same manner as the above nano-wire capacitors.

The DRAM of this Example has a constitution shown in FIGS. 18 and 19, comprising semiconductor nano-wire transistors, nano-wire capacitors, word lines, bit lines and driving circuit. In production of the DRAM, firstly, wirings of word lines, bit lines, and so forth are formed by vapor deposition of Au. Then the semiconductor nano-wires for the semiconductor nano-wire transistors are formed by coating application. The wirings are passivated with a UV-setting resin to prevent exfoliation from the substrate to form transistors. Then the above nano-wire capacitors are applied and arranged by coating on the TFTs in a similar manner as the above semiconductor nano-wires, and the nano-wire capacitors are passivated with a UV-setting resin to form capacitors on the TFTs. Finally, driving circuit is connected thereto to complete a DRAM.

The DRAM of this Example, which employs semiconductor nano-wires and nano-wire capacitors of tens of nanometers in diameter, has high memory capacity owing to the high density of the circuit in comparison with DRAMs produced by a conventional light exposure process.

In the production of the DRAM above, transistors and capacitors are formed on a substrate (a glass substrate in this Example) by coating without employing a vacuum process. Thereby the DRAM can be provided with a larger element area at a higher density at a lower cost. The DRAM has a large capacity which has not been achieved.

(Industrial Applicability)

The nano-wire capacitor and a circuit device with the nano-wire capacitors are useful as electric circuits and circuit devices having capacitors such as TFT substrates for active matrix-driven display apparatus, and recording apparatuses like DRAMs.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-352576, filed on Dec. 6, 2005, which is hereby incorporated by reference herein in its entirety.

What is claimed is:

1. A capacitor, comprising:
   a first electrode comprised of an electroconductive nano-wire;
   a dielectric layer partly covering the peripheral face of the first electrode; and
   a second electrode covering the peripheral face of the dielectric layer,
   wherein the dielectric layer is divided into at least two portions covering the first electrode, the second electrode covers the at least two portions of the dielectric layer, and the first electrode is bared between the divided portions, and
   wherein the bared portion of the first electrode is in a middle portion of the capacitor.

* * * * *